United States Patent
Yang et al.

(10) Patent No.: US 8,741,778 B2
(45) Date of Patent: Jun. 3, 2014

(54) UNIFORM DRY ETCH IN TWO STAGES

(75) Inventors: Dongqing Yang, San Jose, CA (US);
Jing Tang, Santa Clara, CA (US); Nitin Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 142 days.

(21) Appl. No.: 13/197,487

(22) Filed: Aug. 3, 2011

(65) Prior Publication Data

US 2012/0196447 A1     Aug. 2, 2012

Related U.S. Application Data

(60) Provisional application No. 61/422,942, filed on Dec. 14, 2010.

(51) Int. Cl.
*H01L 21/302*     (2006.01)

(52) U.S. Cl.
USPC .............. 438/723; 438/713; 438/734; 216/74

(58) Field of Classification Search
USPC ......................................................... 216/74
See application file for complete search history.

(56) References Cited

U.S. PATENT DOCUMENTS

| | | |
|---|---|---|
| 3,451,840 A | 6/1969 | Hough |
| 4,214,946 A | 7/1980 | Forget et al. |
| 4,468,413 A | 8/1984 | Bachmann |
| 4,571,819 A | 2/1986 | Rogers et al. |
| 4,656,052 A | 4/1987 | Satou et al. |
| 4,690,746 A | 9/1987 | McInerney et al. |
| 4,714,520 A | 12/1987 | Gwozdz |
| 4,749,440 A | 6/1988 | Blackwood et al. |
| 4,851,370 A | 7/1989 | Doklan et al. |
| 4,865,685 A | 9/1989 | Palmour |
| 4,872,947 A | 10/1989 | Wang et al. |
| 4,892,753 A | 1/1990 | Wang et al. |

(Continued)

FOREIGN PATENT DOCUMENTS

| | | |
|---|---|---|
| EP | 0 496 543 A2 | 7/1992 |
| EP | 0 658 928 A1 | 6/1995 |

(Continued)

OTHER PUBLICATIONS

Abraham, "Reactive Facet Tapering of Plasma Oxide for Multilevel Interconnect Applications", IEEE, V-MIC Conference, Jun. 15-16, 1987, pp. 115-121.

(Continued)

*Primary Examiner* — Binh X Tran
*Assistant Examiner* — David Cathey, Jr.
(74) *Attorney, Agent, or Firm* — Kilpatrick Townsend & Stockton LLP

(57) ABSTRACT

A method of etching silicon oxide from a multiple trenches is described which allows more homogeneous etch rates among trenches. The surfaces of the etched silicon oxide within the trench following the etch may also be smoother. The method includes two dry etch stages followed by a sublimation step. The first dry etch stage removes silicon oxide quickly and produces large solid residue granules. The second dry etch stage remove silicon oxide slowly and produces small solid residue granules in amongst the large solid residue granules. Both the small and large solid residue are removed in the ensuing sublimation step. There is no sublimation step between the two dry etch stages.

20 Claims, 5 Drawing Sheets

(56) References Cited

U.S. PATENT DOCUMENTS

| | | | |
|---|---|---|---|
| 4,894,352 A | 1/1990 | Lane et al. |
| 4,960,488 A | 10/1990 | Law et al. |
| 4,981,551 A | 1/1991 | Palmour |
| 5,000,113 A | 3/1991 | Wang et al. |
| 5,013,691 A | 5/1991 | Lory et al. |
| 5,030,319 A | 7/1991 | Nishino et al. |
| 5,061,838 A | 10/1991 | Lane et al. |
| 5,089,442 A | 2/1992 | Olmer |
| 5,156,881 A | 10/1992 | Okano et al. |
| 5,215,787 A | 6/1993 | Homma |
| 5,252,178 A | 10/1993 | Moslehi |
| 5,270,125 A | 12/1993 | America et al. |
| 5,271,972 A | 12/1993 | Kwok et al. |
| 5,275,977 A | 1/1994 | Otsubo et al. |
| 5,279,865 A | 1/1994 | Chebi et al. |
| 5,288,518 A | 2/1994 | Homma |
| 5,290,382 A | 3/1994 | Zarowin et al. |
| 5,302,233 A | 4/1994 | Kim et al. |
| 5,306,530 A | 4/1994 | Strongin et al. |
| 5,314,724 A | 5/1994 | Tsukune et al. |
| 5,316,804 A | 5/1994 | Tomikawa et al. |
| 5,319,247 A | 6/1994 | Matsuura |
| 5,328,810 A | 7/1994 | Lowrey et al. |
| 5,334,552 A | 8/1994 | Homma |
| 5,362,526 A | 11/1994 | Wang et al. |
| 5,385,763 A | 1/1995 | Okano et al. |
| 5,399,529 A | 3/1995 | Homma |
| 5,413,967 A | 5/1995 | Matsuda et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,468,342 A | 11/1995 | Nulty et al. |
| 5,474,589 A | 12/1995 | Ohga et al. |
| 5,483,920 A | 1/1996 | Pryor |
| 5,505,816 A | 4/1996 | Barnes et al. |
| 5,534,070 A | 7/1996 | Okamura et al. |
| 5,536,360 A | 7/1996 | Nguyen et al. |
| 5,558,717 A | 9/1996 | Zhao et al. |
| 5,563,105 A | 10/1996 | Dobuzinsky et al. |
| 5,571,576 A | 11/1996 | Qian et al. |
| 5,599,740 A | 2/1997 | Jang et al. |
| 5,624,582 A | 4/1997 | Cain |
| 5,626,922 A | 5/1997 | Miyanaga et al. |
| 5,645,645 A | 7/1997 | Zhang et al. |
| 5,648,175 A | 7/1997 | Russell et al. |
| 5,661,093 A | 8/1997 | Ravi et al. |
| 5,679,606 A | 10/1997 | Wang et al. |
| 5,712,185 A | 1/1998 | Tsai et al. |
| 5,719,085 A | 2/1998 | Moon et al. |
| 5,756,402 A | 5/1998 | Jimbo et al. |
| 5,786,276 A | 7/1998 | Brooks et al. |
| 5,789,300 A | 8/1998 | Fulford |
| 5,804,259 A | 9/1998 | Robles |
| 5,820,723 A | 10/1998 | Benjamin et al. |
| 5,838,055 A | 11/1998 | Kleinhenz et al. |
| 5,849,639 A | 12/1998 | Molloy et al. |
| 5,850,105 A | 12/1998 | Dawson et al. |
| 5,858,876 A | 1/1999 | Chew |
| 5,872,052 A | 2/1999 | Iyer |
| 5,872,058 A | 2/1999 | Van Cleemput et al. |
| 5,882,786 A | 3/1999 | Nassau et al. |
| 5,888,906 A | 3/1999 | Sandhu et al. |
| 5,891,349 A | 4/1999 | Tobe et al. |
| 5,897,751 A | 4/1999 | Makowiecki et al. |
| 5,913,140 A | 6/1999 | Roche et al. |
| 5,915,190 A | 6/1999 | Pirkle |
| 5,920,792 A | 7/1999 | Lin |
| 5,935,334 A | 8/1999 | Fong et al. |
| 5,937,323 A | 8/1999 | Orczyk et al. |
| 5,939,831 A | 8/1999 | Fong et al. |
| 5,944,902 A | 8/1999 | Redeker et al. |
| 5,953,635 A | 9/1999 | Andideh |
| 5,968,610 A | 10/1999 | Liu et al. |
| 5,976,327 A | 11/1999 | Tanaka |
| 5,990,000 A | 11/1999 | Hong et al. |
| 5,990,013 A | 11/1999 | Berenguer et al. |
| 6,013,191 A | 1/2000 | Nasser-Faili et al. |
| 6,013,584 A | 1/2000 | M'Saad |
| 6,020,271 A | 2/2000 | Yanagida |
| 6,030,666 A | 2/2000 | Lam et al. |
| 6,030,881 A | 2/2000 | Papasouliotis et al. |
| 6,037,018 A | 3/2000 | Jang et al. |
| 6,037,266 A | 3/2000 | Tao et al. |
| 6,039,851 A | 3/2000 | Iyer |
| 6,059,643 A | 5/2000 | Hu et al. |
| 6,080,529 A | 6/2000 | Ye et al. |
| 6,087,278 A | 7/2000 | Kim et al. |
| 6,099,697 A | 8/2000 | Hausmann |
| 6,136,685 A | 10/2000 | Narwankar et al. |
| 6,149,828 A | 11/2000 | Vaartstra |
| 6,150,628 A | 11/2000 | Smith et al. |
| 6,167,834 B1 | 1/2001 | Wang et al. |
| 6,170,428 B1 | 1/2001 | Redeker et al. |
| 6,182,602 B1 | 2/2001 | Redeker et al. |
| 6,189,483 B1 | 2/2001 | Ishikawa et al. |
| 6,190,233 B1 | 2/2001 | Hong et al. |
| 6,191,026 B1 | 2/2001 | Rana et al. |
| 6,194,038 B1 | 2/2001 | Rossman |
| 6,197,680 B1 | 3/2001 | Lin et al. |
| 6,197,705 B1 | 3/2001 | Vassiliev |
| 6,203,863 B1 | 3/2001 | Liu et al. |
| 6,204,200 B1 | 3/2001 | Shieh et al. |
| 6,217,658 B1 | 4/2001 | Orczyk et al. |
| 6,228,751 B1 | 5/2001 | Yamazaki et al. |
| 6,238,582 B1 | 5/2001 | Williams et al. |
| 6,277,752 B1 | 8/2001 | Chen |
| 6,313,035 B1 | 11/2001 | Sandhu et al. |
| 6,335,261 B1 | 1/2002 | Natzle et al. |
| 6,335,288 B1 | 1/2002 | Kwan et al. |
| 6,372,657 B1 | 4/2002 | Hineman et al. |
| 6,379,575 B1 | 4/2002 | Yin et al. |
| 6,387,207 B1 | 5/2002 | Janakiraman et al. |
| 6,395,150 B1 | 5/2002 | Van Cleemput et al. |
| 6,403,491 B1 | 6/2002 | Liu et al. |
| 6,440,863 B1 | 8/2002 | Tsai et al. |
| 6,477,980 B1 | 11/2002 | White et al. |
| 6,479,373 B2 | 11/2002 | Dreybrodt et al. |
| 6,503,843 B1 | 1/2003 | Xia et al. |
| 6,527,968 B1 | 3/2003 | Wang et al. |
| 6,531,377 B2 | 3/2003 | Knorr et al. |
| 6,569,773 B1 | 5/2003 | Gellrich et al. |
| 6,573,030 B1 | 6/2003 | Fairbairn et al. |
| 6,596,602 B2 | 7/2003 | Iizuka et al. |
| 6,596,654 B1 | 7/2003 | Bayman et al. |
| 6,602,434 B1 | 8/2003 | Hung et al. |
| 6,677,242 B1 | 1/2004 | Liu et al. |
| 6,677,247 B2 | 1/2004 | Yuan et al. |
| 6,706,334 B1 * | 3/2004 | Kobayashi et al. ........... 427/534 |
| 6,759,261 B2 | 7/2004 | Shimokohbe et al. |
| 6,772,827 B2 | 8/2004 | Keller et al. |
| 6,794,290 B1 | 9/2004 | Papasouliotis et al. |
| 6,796,314 B1 | 9/2004 | Graff |
| 6,802,944 B2 | 10/2004 | Ahmad et al. |
| 6,808,748 B2 | 10/2004 | Kapoor et al. |
| 6,823,589 B2 | 11/2004 | White et al. |
| 6,830,624 B2 | 12/2004 | Janakiraman et al. |
| 6,846,745 B1 | 1/2005 | Papasouliotis et al. |
| 6,867,141 B2 | 3/2005 | Jung et al. |
| 6,869,880 B2 | 3/2005 | Krishnaraj et al. |
| 6,903,031 B2 | 6/2005 | Karim et al. |
| 6,903,511 B2 | 6/2005 | Chistyakov |
| 6,908,862 B2 | 6/2005 | Li et al. |
| 6,924,191 B2 | 8/2005 | Liu et al. |
| 6,942,753 B2 | 9/2005 | Choi et al. |
| 6,951,821 B2 | 10/2005 | Hamelin et al. |
| 6,958,175 B2 | 10/2005 | Sakamoto et al. |
| 6,974,780 B2 | 12/2005 | Schuegraf |
| 7,017,269 B2 | 3/2006 | White et al. |
| 7,078,312 B1 | 7/2006 | Sutanto et al. |
| 7,081,414 B2 | 7/2006 | Zhang et al. |
| 7,084,070 B1 | 8/2006 | Lee et al. |
| 7,115,525 B2 | 10/2006 | Abatchev et al. |
| 7,183,214 B2 | 2/2007 | Nam et al. |

(56) References Cited

U.S. PATENT DOCUMENTS

| | | | |
|---|---|---|---|
| 7,196,342 B2 | 3/2007 | Ershov et al. | |
| 7,205,240 B2 | 4/2007 | Karim et al. | |
| 7,223,701 B2 | 5/2007 | Min et al. | |
| 7,226,805 B2 | 6/2007 | Hallin et al. | |
| 7,288,482 B2 | 10/2007 | Panda et al. | |
| 7,390,710 B2 | 6/2008 | Derderian et al. | |
| 7,484,473 B2 | 2/2009 | Keller et al. | |
| 7,488,688 B2 | 2/2009 | Chung et al. | |
| 7,494,545 B2 | 2/2009 | Lam et al. | |
| 7,581,511 B2 | 9/2009 | Mardian et al. | |
| 7,628,897 B2 | 12/2009 | Mungekar et al. | |
| 7,709,396 B2 | 5/2010 | Bencher et al. | |
| 7,722,925 B2 | 5/2010 | White et al. | |
| 7,785,672 B2 | 8/2010 | Choi et al. | |
| 7,807,578 B2 | 10/2010 | Bencher et al. | |
| 7,871,926 B2 | 1/2011 | Xia et al. | |
| 7,910,491 B2 | 3/2011 | Soo Kwon et al. | |
| 7,915,139 B1 | 3/2011 | Lang et al. | |
| 7,939,422 B2 | 5/2011 | Ingle et al. | |
| 7,968,441 B2 | 6/2011 | Xu | |
| 7,981,806 B2 | 7/2011 | Jung | |
| 8,008,166 B2 | 8/2011 | Sanchez et al. | |
| 8,058,179 B1* | 11/2011 | Draeger et al. | 438/714 |
| 8,071,482 B2 | 12/2011 | Kawada | |
| 8,074,599 B2 | 12/2011 | Choi et al. | |
| 8,083,853 B2 | 12/2011 | Choi et al. | |
| 8,187,486 B1 | 5/2012 | Liu et al. | |
| 8,211,808 B2 | 7/2012 | Sapre et al. | |
| 8,309,440 B2 | 11/2012 | Sanchez et al. | |
| 8,328,939 B2 | 12/2012 | Choi et al. | |
| 2001/0028922 A1 | 10/2001 | Sandhu | |
| 2002/0016080 A1 | 2/2002 | Khan et al. | |
| 2002/0045966 A1 | 4/2002 | Lee et al. | |
| 2002/0177322 A1 | 11/2002 | Li et al. | |
| 2002/0187655 A1 | 12/2002 | Tan et al. | |
| 2002/0197823 A1 | 12/2002 | Yoo et al. | |
| 2003/0032284 A1 | 2/2003 | Enomoto et al. | |
| 2003/0077909 A1 | 4/2003 | Jiwari | |
| 2003/0087531 A1 | 5/2003 | Kang et al. | |
| 2003/0109143 A1 | 6/2003 | Hsieh et al. | |
| 2003/0173333 A1 | 9/2003 | Wang et al. | |
| 2003/0199170 A1 | 10/2003 | Li | |
| 2003/0224217 A1 | 12/2003 | Byun et al. | |
| 2003/0224617 A1 | 12/2003 | Baek et al. | |
| 2004/0110354 A1 | 6/2004 | Natzle et al. | |
| 2004/0129224 A1 | 7/2004 | Yamazaki | |
| 2004/0211357 A1 | 10/2004 | Gadgil et al. | |
| 2004/0245091 A1 | 12/2004 | Karim et al. | |
| 2005/0001276 A1 | 1/2005 | Gao et al. | |
| 2005/0026431 A1 | 2/2005 | Kazumi et al. | |
| 2005/0048801 A1 | 3/2005 | Karim et al. | |
| 2005/0090120 A1 | 4/2005 | Hasegawa et al. | |
| 2005/0112901 A1 | 5/2005 | Ji et al. | |
| 2005/0121750 A1 | 6/2005 | Chan et al. | |
| 2005/0181588 A1 | 8/2005 | Kim | |
| 2005/0230350 A1 | 10/2005 | Kao et al. | |
| 2005/0266691 A1 | 12/2005 | Gu et al. | |
| 2006/0019486 A1 | 1/2006 | Yu et al. | |
| 2006/0024956 A1 | 2/2006 | Zhijian et al. | |
| 2006/0046419 A1 | 3/2006 | Sandhu et al. | |
| 2006/0046484 A1 | 3/2006 | Abatchev et al. | |
| 2006/0051966 A1 | 3/2006 | Or et al. | |
| 2006/0093756 A1 | 5/2006 | Rajagopalan et al. | |
| 2006/0166515 A1 | 7/2006 | Karim et al. | |
| 2006/0207504 A1 | 9/2006 | Hasebe et al. | |
| 2006/0211260 A1 | 9/2006 | Tran et al. | |
| 2006/0216923 A1 | 9/2006 | Tran et al. | |
| 2006/0240661 A1 | 10/2006 | Annapragada et al. | |
| 2006/0246717 A1 | 11/2006 | Wang | |
| 2006/0264003 A1 | 11/2006 | Eun | |
| 2007/0072408 A1 | 3/2007 | Enomoto et al. | |
| 2007/0099431 A1 | 5/2007 | Li | |
| 2007/0099438 A1 | 5/2007 | Ye et al. | |
| 2007/0107750 A1 | 5/2007 | Sawin et al. | |
| 2007/0108404 A1 | 5/2007 | Stewart et al. | |
| 2007/0123051 A1 | 5/2007 | Arghavani et al. | |
| 2007/0197028 A1 | 8/2007 | Byun et al. | |
| 2007/0232071 A1 | 10/2007 | Balseanu et al. | |
| 2007/0238321 A1 | 10/2007 | Futase et al. | |
| 2007/0269976 A1 | 11/2007 | Futase et al. | |
| 2007/0281106 A1 | 12/2007 | Lubomirsky et al. | |
| 2008/0099431 A1 | 5/2008 | Kumar et al. | |
| 2008/0124919 A1 | 5/2008 | Huang et al. | |
| 2008/0124937 A1 | 5/2008 | Xu et al. | |
| 2008/0142483 A1 | 6/2008 | Hua et al. | |
| 2008/0162781 A1 | 7/2008 | Haller et al. | |
| 2008/0182381 A1* | 7/2008 | Kiyotoshi | 438/427 |
| 2008/0182382 A1 | 7/2008 | Ingle et al. | |
| 2008/0233709 A1 | 9/2008 | Conti et al. | |
| 2008/0261404 A1 | 10/2008 | Kozuka et al. | |
| 2008/0292798 A1 | 11/2008 | Huh et al. | |
| 2009/0045167 A1 | 2/2009 | Maruyama | |
| 2009/0104738 A1 | 4/2009 | Ring et al. | |
| 2009/0104764 A1 | 4/2009 | Xia et al. | |
| 2009/0104772 A1 | 4/2009 | Lu et al. | |
| 2009/0191714 A1* | 7/2009 | Lai et al. | 438/706 |
| 2009/0275205 A1 | 11/2009 | Kiehlbauch et al. | |
| 2009/0275206 A1 | 11/2009 | Katz et al. | |
| 2010/0059889 A1 | 3/2010 | Gosset et al. | |
| 2010/0075503 A1 | 3/2010 | Bencher et al. | |
| 2010/0093151 A1 | 4/2010 | Arghavani et al. | |
| 2010/0098884 A1 | 4/2010 | Balseanu et al. | |
| 2010/0099236 A1 | 4/2010 | Kwon et al. | |
| 2010/0099263 A1 | 4/2010 | Kao et al. | |
| 2010/0105209 A1 | 4/2010 | Winniczek et al. | |
| 2010/0173499 A1 | 7/2010 | Tao et al. | |
| 2011/0008950 A1 | 1/2011 | Xu | |
| 2011/0053380 A1 | 3/2011 | Sapre et al. | |
| 2011/0143542 A1 | 6/2011 | Feurprier et al. | |
| 2011/0151674 A1 | 6/2011 | Tang et al. | |
| 2011/0151676 A1 | 6/2011 | Ingle et al. | |
| 2011/0151677 A1 | 6/2011 | Wang et al. | |
| 2011/0165771 A1 | 7/2011 | Ring et al. | |
| 2011/0230052 A1 | 9/2011 | Tang et al. | |
| 2011/0266252 A1 | 11/2011 | Thadani et al. | |
| 2011/0294300 A1 | 12/2011 | Zhang et al. | |
| 2012/0009796 A1 | 1/2012 | Cui et al. | |
| 2012/0211462 A1 | 8/2012 | Zhang et al. | |
| 2012/0238102 A1 | 9/2012 | Zhang et al. | |
| 2012/0238103 A1 | 9/2012 | Zhang et al. | |
| 2012/0285621 A1 | 11/2012 | Tan | |
| 2013/0034968 A1 | 2/2013 | Zhang et al. | |
| 2013/0045605 A1 | 2/2013 | Wang et al. | |
| 2013/0052827 A1 | 2/2013 | Wang et al. | |
| 2013/0059440 A1 | 3/2013 | Wang et al. | |
| 2013/0089988 A1 | 4/2013 | Wang et al. | |

FOREIGN PATENT DOCUMENTS

| | | |
|---|---|---|
| JP | 61-276977 A | 12/1986 |
| JP | 2058836 A | 2/1990 |
| JP | 4-239750 | 7/1992 |
| JP | 4-341568 A | 11/1992 |
| JP | 07-130713 A | 5/1995 |
| JP | 7-161703 A | 6/1995 |
| JP | 08-306671 A | 11/1996 |
| JP | 09153481 A | 6/1997 |
| JP | 2000-012514 A | 1/2000 |
| JP | 2002-141349 | 5/2002 |
| JP | 2002-256235 | 9/2002 |
| JP | 2004-047956 A | 2/2004 |
| JP | 04-239723 A | 8/2004 |
| JP | 2005-033023 A | 2/2005 |
| JP | 2007-173383 A | 7/2007 |
| JP | 08-148470 A | 6/2008 |
| KR | 2000-0044928 | 7/2000 |
| KR | 10-2001-0049274 A | 6/2001 |
| KR | 10-2004-0049739 A | 6/2004 |
| KR | 10-2010-0013980 A | 2/2010 |
| KR | 10-1050454 B1 | 7/2011 |
| WO | WO 92/20833 A1 | 11/1992 |
| WO | WO 99/062108 A2 | 12/1999 |
| WO | WO 00/13225 A1 | 3/2000 |
| WO | WO 2004/114366 A2 | 12/2004 |

(56) References Cited

FOREIGN PATENT DOCUMENTS

| WO | WO 2006/069085 A2 | 6/2006 |
|----|-------------------|--------|
| WO | WO 2011/087580 A1 | 7/2011 |
| WO | WO 2011/115761 A2 | 9/2011 |
| WO | WO 2011/139435 A2 | 11/2011 |
| WO | WO 2012/125654 A2 | 9/2012 |

OTHER PUBLICATIONS

Applied Materials, Inc., "Applied Siconi™ Preclean," printed on Aug. 7, 2009, 8 pages.

Carlson, et al., "A Negative Spacer Lithography Process for Sub-100nm Contact Holes and Vias", University of California at Berkeley, Jun. 19, 2007, 4 pp.

Chang et al. "Frequency Effects and Properties of Plasma Deposited Fluorinated Silicon Nitride", J. Vac Sci Technol B 6(2), Mar./Apr. 1988, pp. 524-532.

Cheng, et al., "New Test Structure to Identify Step Coverage Mechanisms in Chemical Vapor Deposition of Silicon Dioxide," Appl. Phys. Lett., 58 (19), May 13, 1991, p. 2147-2149.

Fukada et al. "Preparation of SiOF Films with Low Dielectric Constant by ECR Plasma CVD", ISMIC, DUMIC Conference, Feb. 21-22, 1995, pp. 43-49.

Galiano et al. "Stress-Temperature Behavior of Oxide Films Used for Intermetal Dielectric Applications", VMIC Conference, Jun. 9-10, 1992, pp. 100-106.

Hausmann, et al., "Rapid Vapor Deposition of Highly Conformal Silica Nanolaminates," Science, Oct. 11, 2002, p. 402-406, vol. 298.

Hayasaka, N. et al. "High Quality Low Dielectric Constant SiO2 CVD Using High Density Plasma," Proceedings of the Dry Process Symposium, 1993, pp. 163-168.

Hwang et al., "Smallest Bit-Line Contact of 76nm pitch on NAND Flash Cell by using Reversal PR (Photo Resist) and SADP (Self-Align Double Patterning) Process," IEEE/SEMI Advanced Semiconductor Manufacturing Conference, 2007, 3 pages.

Iijima, et al., "Highly Selective $SiO_2$ Etch Employing Inductively Coupled Hydro-Fluorocarbon Plasma Chemistry for Self Aligned Contact Etch", Jpn. J. Appl. Phys., Sep. 1997, pp.. 5498-5501, vol. 36, Part 1, No. 9A.

International Search Report and Written Opinion for PCT Application No. PCT/US2011/027221, mailed on Nov. 1, 2011, 8 pages.

International Search Report and Written Opinion of PCT/US2010/057676 mailed on Jun. 27, 2011, 9 pages.

International Search Report and Written Opinion of PCT/US2011/030582 mailed Dec. 7, 2011, 9 pages.

International Search Report and Written Opinion of PCT/US2011/064724 mailed on Oct. 12, 2012, 8 pages.

International Search Report and Written Opinion of PCT/US2012/028952 mailed on Oct. 29, 2012, 9 pages.

International Search Report and Written Opinion of PCT/US2012/048842 mailed on Nov. 28, 2012, 10 pages.

International Search Report and Written Opinion of the International Searching Authority for PCT Application No. PCT/US2012/028957, mailed on Oct. 18, 2012, 9 pages.

International Search Report of PCT/US2009/059743 mailed on Apr. 26, 2010, 4 pages.

Japanese Patent Office, Official Action for Application No. 2007-317207 mailed on Dec. 21, 2011, 2 pages.

Jung, et al., "Patterning with amorphous carbon spacer for expanding the resolution limit of current lithography tool", Proc. SPIE , 2007, 9 pages, vol. 6520, 65201C.

Laxman, "Low ϵ Dielectrics: CVD Fluorinated Silicon Dioxides", Semiconductor International, May 1995, pp. 71-74.

Lee, et al., "Dielectric Planarization Techniques for Narrow Pitch Multilevel Interconnects," IEEE, V-MIC Conference Jun. 15-16, 1987, pp. 85-92 (1987).

Matsuda, et al. "Dual Frequency Plasma CVD Fluorosilicate Glass Deposition for 0.25 um Interlevel Dielectrics", ISMIC, DUMIC Conference Feb. 21-22, 1995, pp. 22-28.

Meeks, Ellen et al., "Modeling of $SiO_2$ deposition in high density plasma reactors and comparisons of model predictions with experimental measurements," J. Vac. Sci. Technol. A, Mar./Apr. 1998, pp. 544-563, vol. 16(2).

Mukai, et al., "A Study of CD Budget in Spacer Patterning Process", Toshiba, SPIE 2008, Feb. 26, 2008, 12 pages.

Musaka, "Single Step Gap Filling Technology fo Subhalf Micron Metal Spacings on Plasma Enhanced $TEOS/O_2$ Chemical Vapor Deposition System," Extended Abstracts of the 1993 International Conference on Solid State Devices and Materials pages, 1993, 510-512.

Ogawa, et al., "Dry Cleaning Technology for Removal of Silicon Native Oxide Employing Hot NH3/NF3 Exposure", Japanese Journal of Applied Physics, pp. 5349-5358, Aug. 2002, vol. 41 Part 1, No. 8.

Ota, et al., "Stress Controlled Shallow Trench Isolation Technology to Suppress the Novel Anti-Isotropic Impurity Diffusion for 45nm-Node High Performance CMOSFETs," Symposium on VLSI Technology Digest of Technical Papers, 2005, pp. 138-139.

Qian, et al., "High Density Plasma Deposition and Deep Submicron Gap Fill with Low Dielectric Constant SiOF Films," ISMIC, DUMIC Conference Feb. 21-22, 1995, pp. 50-56.

Robles, et al. "Effects of RF Frequency and Deposition Rates on the Moisture Resistance of PECVD TEOS-Based Oxide Films", ECS Extended Abstracts, Abstract No. 129, May 1992, pp. 215-216, vol. 92-1.

Shapiro, et al. "Dual Frequency Plasma CVD Fluorosilicate Glass: Water Absorption and Stability", ISMIC, DUMIC Conference Feb. 21-22, 1995, pp. 118-123.

Smayling, et al., "APF® Pitch-Halving for 2nm Logic Cells using Gridded Design Rules", proceedings of the SPIE, 2008, 8 pages.

U.S. Appl. No. 60/803,499, filed May 30, 2006, 56 pages.

Usami, et al., "Low Dielectric Constant Interlayer Using Fluorine-Doped Silicon Oxide", Jpn. J. Appl. Phys., Jan. 19, 1994. pp. 408-412, vol. 33 Part 1, No. 1B.

Vassiliev, et al., "Trends in void-free pre-metal CVD dielectrics," Solid State Technology, Mar. 2001, pp. 129-136.

Weston, et al., "Ammonium Compounds," Kirk-Othmer Encyclopedia of Chemical Technology, 2003,30 pages see pp. 717-718, John Wiley & Sons, Inc.

Yu, et al., "Step Coverage Study of Peteos Deposition for Intermetal Dielectric Applications," abstract, VMIC conference, Jun. 12-13, 1990, 7 pages, No. 82.

Yutaka, et al., "Selective Etching of Silicon Native Oxide with Remote-Plasma-Excited Anhydrous Hydrogen Fluoride," Japanese Journal of Applied Physics, 1998, vol. 37, pp. L536-L538.

International Search Report and Written Opinion of PCT/US2012/053329 mailed on Feb. 15, 2013, 8 pages.

International Search Report and Written Opinion of PCT/US2012/058818 mailed on Apr. 1, 2013, 9 pages.

International Search Report and Written Opinion of PCT/US2012/057294 mailed on Mar. 18, 2013, 12 pages.

International Search Report and Written Opinion of PCT/US2012/057358 mailed on Mar. 25, 2013, 10 pages.

* cited by examiner

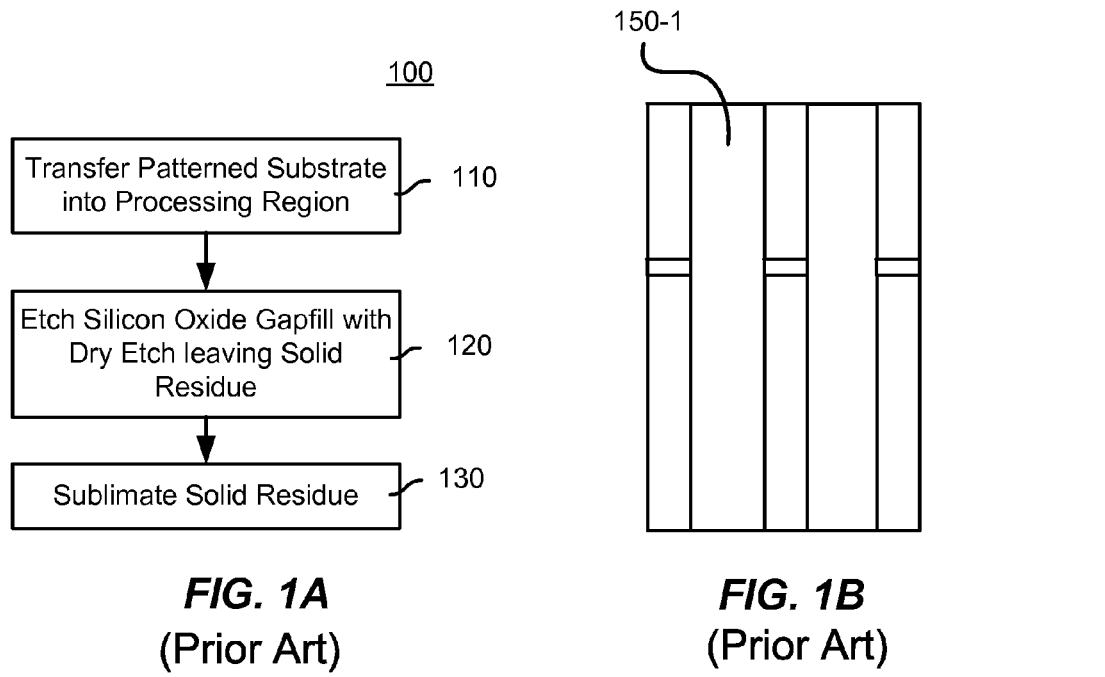
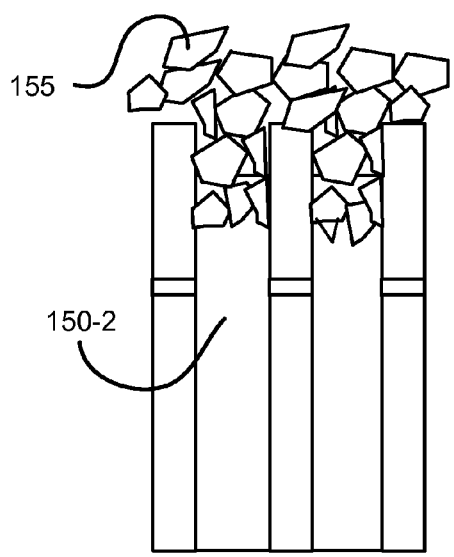
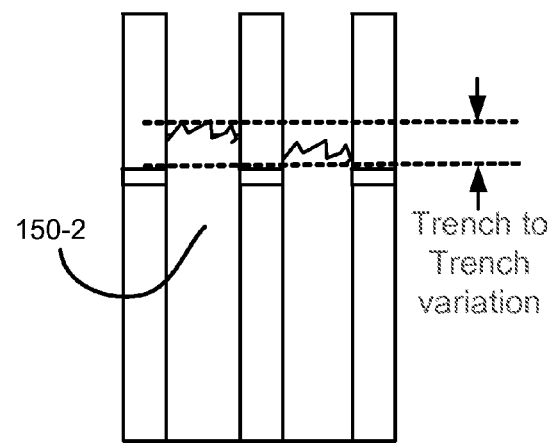
*FIG. 1A*
(Prior Art)
*FIG. 1B*
(Prior Art)
*FIG. 1C*
(Prior Art)
*FIG. 1D*
(Prior Art)

UNIFORM DRY ETCH IN TWO STAGES

CROSS-REFERENCES TO RELATED APPLICATIONS

This application claims the benefit of U.S. Provisional Patent Application No. 61/422,942 filed Dec. 14, 2010, which is incorporated herein by reference in its entirety for all purposes.

BACKGROUND OF THE INVENTION

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective to the first material. As a result of the diversity of materials, circuits and processes, etch processes have been developed with a selectivity towards a variety of materials.

A Siconi™ etch is a remote plasma assisted dry etch process which involves the simultaneous exposure of a substrate to $H_2$, $NF_3$ and $NH_3$ plasma by-products. Remote plasma excitation of the hydrogen and fluorine species allows plasma-damage-free substrate processing. The Siconi™ etch is largely conformal and selective towards silicon oxide layers but does not readily etch silicon regardless of whether the silicon is amorphous, crystalline or polycrystalline. The selectivity provides advantages for applications such as shallow trench isolation (STI) and inter-layer dielectric (ILD) recess formation.

FIGS. 1-2 show a flowchart of dry etch processing steps and associated schematic side-views of silicon oxide trimmed from trenches on a patterned substrate. The process begins when a patterned substrate is transferred into the processing region (operation 110). The silicon oxide selective dry etch begins (operation 120) when plasma by-products are delivered to the processing region. The selective dry etch results in the consumption of silicon oxide 150-1 from within the trenches and the associated production of solid residue 155 above the remaining silicon oxide 150-2.

The Siconi™ process produces solid by-products 155 which grow on the surface of the substrate as substrate material is removed. The solid by-products are subsequently removed via sublimation (operation 130) when the temperature of the substrate is raised. Silicon oxide surface roughness and inter-trench etch rate variability may be observed following sublimation.

Methods are needed to provide greater uniformity of dry etch processes.

BRIEF SUMMARY OF THE INVENTION

A method of etching silicon oxide from a multiple trenches is described which allows more homogeneous etch rates among trenches. The surfaces of the etched silicon oxide within the trench following the etch may also be smoother. The method includes two dry etch stages followed by a sublimation step. The first dry etch stage removes silicon oxide quickly and produces large solid residue granules. The second dry etch stage remove silicon oxide slowly and produces small solid residue granules in amongst the large solid residue granules. Both the small and large solid residue are removed in the ensuing sublimation step. There is no sublimation step between the two dry etch stages.

Embodiments of the invention include methods of etching silicon oxide from multiple trenches on a surface of a patterned substrate in a substrate processing region of a substrate processing chamber. The methods include the sequential steps of (1) dry etching the silicon oxide in each of the multiple trenches in a first dry-etch stage to form first solid by-products on the surface of a remaining silicon oxide in the multiple trenches, (2) dry etching the silicon oxide in each of the multiple trenches in a second dry-etch stage to form second solid by-products on the surface of a remaining silicon oxide in the multiple trenches, and (3) sublimating the first and second solid by-products from the multiple trenches. The silicon oxide is removed at a first etch rate during the first dry-etch stage. A second etch rate of the silicon oxide during the second dry-etch stage is less than the first etch rate.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

FIGS. 1A-1D are a flowchart of dry etch processing steps and associated schematic side-views of silicon oxide trimmed from trenches on a patterned substrate.

Figure 2:
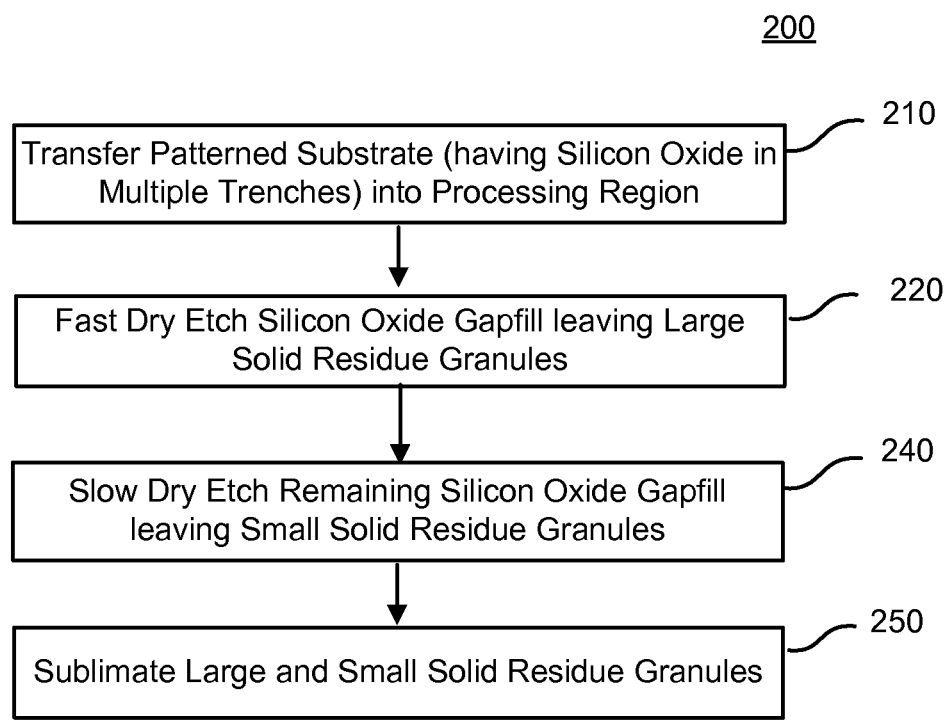
FIG. 2 is a flow chart of a dry etch process according to disclosed embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

A method of etching silicon oxide from a multiple trenches is described which allows more homogeneous etch rates among trenches. The surfaces of the etched silicon oxide within the trench following the etch may also be smoother. The method includes two dry etch stages followed by a sublimation step. The first dry etch stage removes silicon oxide quickly and produces large solid residue granules. The second dry etch stage remove silicon oxide slowly and produces small solid residue granules in amongst the large solid residue granules. Both the small and large solid residue are removed in the ensuing sublimation step. There is no sublimation step between the two dry etch stages.

Siconi™ etch processes are an example of a dry etch process and have used a hydrogen source such as ammonia ($NH_3$) in combination with a fluorine source such as nitrogen trifluoride ($NF_3$). The combination flows into a remote plasma system (RPS) and the plasma effluents created therein are flowed into a substrate processing region. The effluents react with exposed silicon oxide to form solid residue which is then sublimated from the surface to complete the etch process. A thickness variation may be observed across a silicon oxide surface treated with such a dry etch. The thickness variation may manifest itself as a roughness across a blanket film, a wide trench or even the silicon surface within a narrow trench. Another manifestation of the thickness variation may be observed as a etch rate variation among relatively narrow trenches. Silicon oxide gapfill may be etched at different rates in adjacent trenches.

Performing a Siconi™ etch using two sequential dry-etch stages followed by a sublimation stage reduces the etch rate variation among the narrow trenches. The first dry-etch stage is similar to prior art Siconi™ processes. The solid by-products formed during the first stage are relatively large and expose varying surface areas between similarly sized narrow trenches in disclosed embodiments. The second dry-etch stage etches silicon oxide at a slower rate. The etchants of the second dry-etch stage can diffuse through pores of the relatively large solid by-products and react with the varying exposed surface areas of silicon oxide underlying the large solid by-products. The second dry-etch stages produces relatively small solid by-products in amongst the large by-products. The quantity of small solid by-products, by weight, may be larger within trenches having a smaller quantity of large solid by-products. In this way, the consumption of silicon oxide (i.e. the overall etch rate of the silicon oxide) is evened out so the etch rate between multiple narrow trenches ends up being more uniform. The trench-to-trench uniformity is therefore improved by combining two dry-etch stages in sequence without a sublimation step in between. A sublimation step is performed after the two dry-etch stages to remove both the large and small solid by-products.

In order to better understand and appreciate the invention, reference is now made to FIGS. 2 and 3A-3D which are a flow chart of a dry etch process applied to a patterned substrate and depictions of the patterned substrate during the process, respectively, according to disclosed embodiments. The process begins when a patterned substrate having silicon oxide gapfill 350-1 in multiple trenches is transferred into a processing chamber (operation 210, FIG. 3A). Flows of ammonia and nitrogen trifluoride are initiated into a plasma region separate from the processing region. The separate plasma region may be referred to as a remote plasma region herein and may be a distinct module from the processing chamber or a compartment within the processing chamber separated from the substrate processing region by a showerhead. Plasma effluents created in the remote plasma region travel into the substrate processing region to interact with the patterned substrate to remove silicon oxide.

Figure 3A:
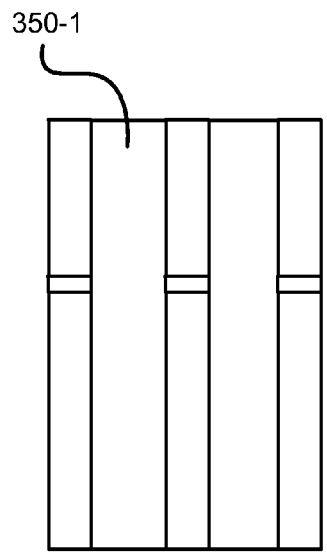
FIGS. 3A-3D depict schematic side-views of silicon oxide trimmed from trenches on a patterned substrate according to disclosed embodiments.
Figure 3B:
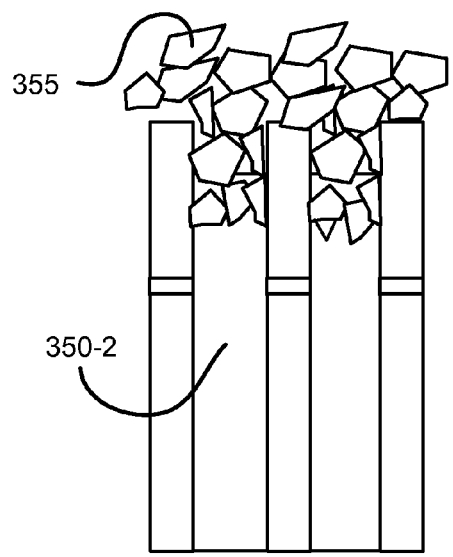
Figure 3C:
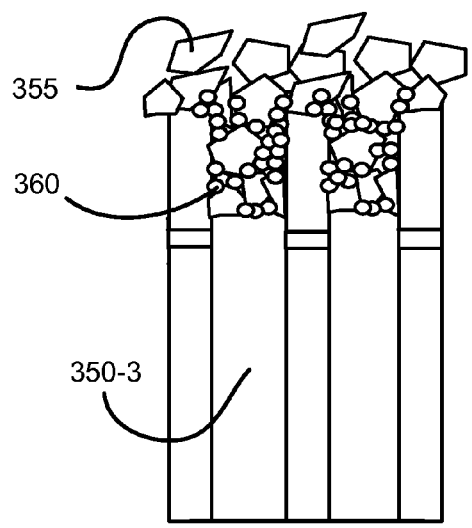

The interaction of the plasma effluents and the silicon oxide is separated into two phases. During the first phase, process parameters are selected to quickly remove the silicon oxide gapfill material (operation 220) leaving first solid residue granules 355 as shown in FIG. 3B. Then the process parameters are adjusted to begin the second phase of the dry etch. During this second phase of the dry etch, silicon oxide gapfill is removed at a slower rate (operation 240) and produces second solid residue granules 360 in amongst the first solid residue granules 355 over silicon oxide gapfill 350-3 as shown in FIG. 3C. For the purposes of measuring etch rates, it should be noted that the etch rate characterizes the silicon oxide removed. The etch interface is under the solid residue 355, 360. It is not necessary to remove the solid residue to gauge the etch rate, but it becomes easier to see the interface after the sublimation of the solid residue. The temperature of the silicon oxide during the interaction with the plasma effluents may be below one of 60° C., 50° C., 40° C. or 35° C., in different embodiments.

Figure 3D:
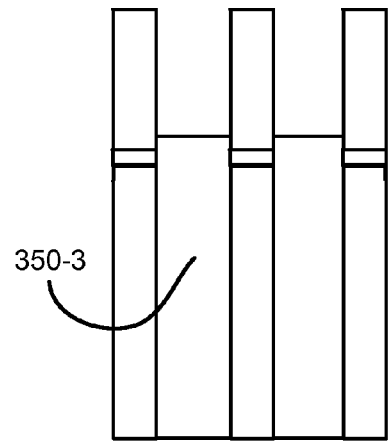

The substrate is heated to sublimate the solid by-products (operation 250) and a schematic of the result is shown in FIG. 3D. The first solid residue granules 355 and the second solid residue granules 360 are both removed by the sublimation process. The temperature of the solid residue and the silicon oxide may be raised above one of 90° C., 100° C., 120° C. or 140° C. during the full sublimation, in different embodiments. The duration of the sublimation may be above one of 45 seconds, 60 seconds, 75 seconds, 90 seconds or 120 seconds, in different embodiments. The width of the trenches may be less than one of 35 nm, 30 nm, 25 nm, 20 nm or 15 nm, in disclosed embodiments.

Altering the process parameters such as flow rates of the plasma effluents, remote plasma power and the durations of the etch process provide the flexibility needed to select the high dry etch rate and the low dry etch rate, in embodiments. The dry etch rate during the first dry-etch stage is greater than the dry etch rate during the second dry-etch stage. The etch rate of silicon oxide during the first dry-etch stage may be greater than (or about) the etch rate during the second dry-etch stage by at least multiplicative factor of about 2, 3 or 5 in disclosed embodiments of the invention. The etch rate of silicon oxide during the first dry-etch stage may also be less than (or about) the etch rate during the second dry-etch stage by a multiplicative factor of about 10 or 5 in embodiments. These upper limits may be combined with the lower limits to form additional embodiments. In a particular embodiment, the etch rate during the first dry-etch stage may be between one and about five times the etch rate during the second dry-etch stage.

The first dry-etch stage may last greater than or about 15 seconds or about 30 seconds, in embodiments. The first dry-etch stage may last less than or about 2 minutes or about 1 minute, in embodiments. Similarly, the second dry-etch stage may last less than or about 30 seconds, 20 seconds or 10 seconds in embodiments of the invention. The second dry-etch stage may last longer than or about 3 seconds, 5 seconds or 10 seconds. Any of the upper limits may be combined with any of the lower limits to provide additional ranges present in additional disclosed embodiments.

The first solid by-products are not sublimated between the first dry-etch stage and second dry-etch stage. Little or essentially no delay is present between the first dry-etch stage and the second dry-etch stage. In other embodiments, there is a pause between the two sets of process conditions during which etchants and other process effluents are removed from the substrate processing region. A variety of precursors may be used to create plasma effluents as described herein.

Generally speaking, a fluorine-containing precursor may be combined with a hydrogen-containing precursor in the remote plasma region to form the plasma effluents used for the etch processes. The fluorine-containing precursor may include one or more of nitrogen trifluoride, hydrogen fluoride, diatomic fluorine, monatomic fluorine and fluorine-substituted hydrocarbons. The hydrogen-containing precursor may include one or more of atomic hydrogen, molecular hydrogen, ammonia, a hydrocarbon and an incompletely halogen-substituted hydrocarbon.

Without wishing to bind the coverage of the claims to hypothetical mechanisms which may or may not be correct, it is thought that the plasma effluents created during the second dry-etch stage are able to diffuse around the relatively large solid residue left by the first dry-etch stage. Either the first dry-etch stage or the second dry-etch stage on their own would create a more non-uniform silicon oxide surface than the sequential combination of the first dry-etch stage followed by the second dry-etch stage. Additional possible mechanisms may involve a greater exposed silicon oxide area in particular trenches which etched more slowly during the first dry-etch stage. This allows the second dry-etch stage effluents to remove a larger net amount of silicon oxide, thereby evening out the combined fast-slow dry etch process.

The etch rate is a complex function of the process parameters. However, examples of fast and slow dry etch processes (during the first and second dry-etch stages, respectively) have been determined. Fast dry etch process during first dry-etch stages are characterized by a faster saturation, i.e. a shorter time before the etch becomes self-limiting. The first dry-etch stage may become self-limiting in about 30 seconds, for example, whereas the second dry-etch stage may become self-limiting in a couple minutes. The delayed saturation is indicative of an enhanced ability to diffuse past solid residue already created. In one embodiment, the etching process of the first dry-etch stage (step 220) would become self-limiting in one minute or less, while the etching process of the second dry-etch stage (step 230) would not become self-limiting until at least two minutes. In another embodiment, the etching process of the first dry-etch stage (step 220) would become self-limiting in 15-45 seconds, while the etching process of the second dry-etch stage (step 230) would not become self-limiting until at least three minutes. With other process parameters constant, a first dry-etch stage may involve a 2:1 ratio of $NH_3:NF_3$ whereas a second dry-etch stage may involve a 10:1 ratio of $NH_3:NF_3$ delivered to the remote plasma region to produce the plasma effluents. This is just an illustrative example of one method of achieving the fast and slow dry etches. Decreasing plasma power by 30% or 50%, in embodiments, from the first dry-etch stage to the second dry-etch stage has also been found to sufficiently reduce dry etch rates with only a small adjustment of the flow ratio (1:1 $NH_3:NF_3$). It is anticipated that there are even more ways achieve fast and slow dry etch processes given the interdependence of the process parameters.

Additional two phase dry etch process parameters are disclosed in the course of describing an exemplary processing system.

Exemplary Processing System

Figure 4:
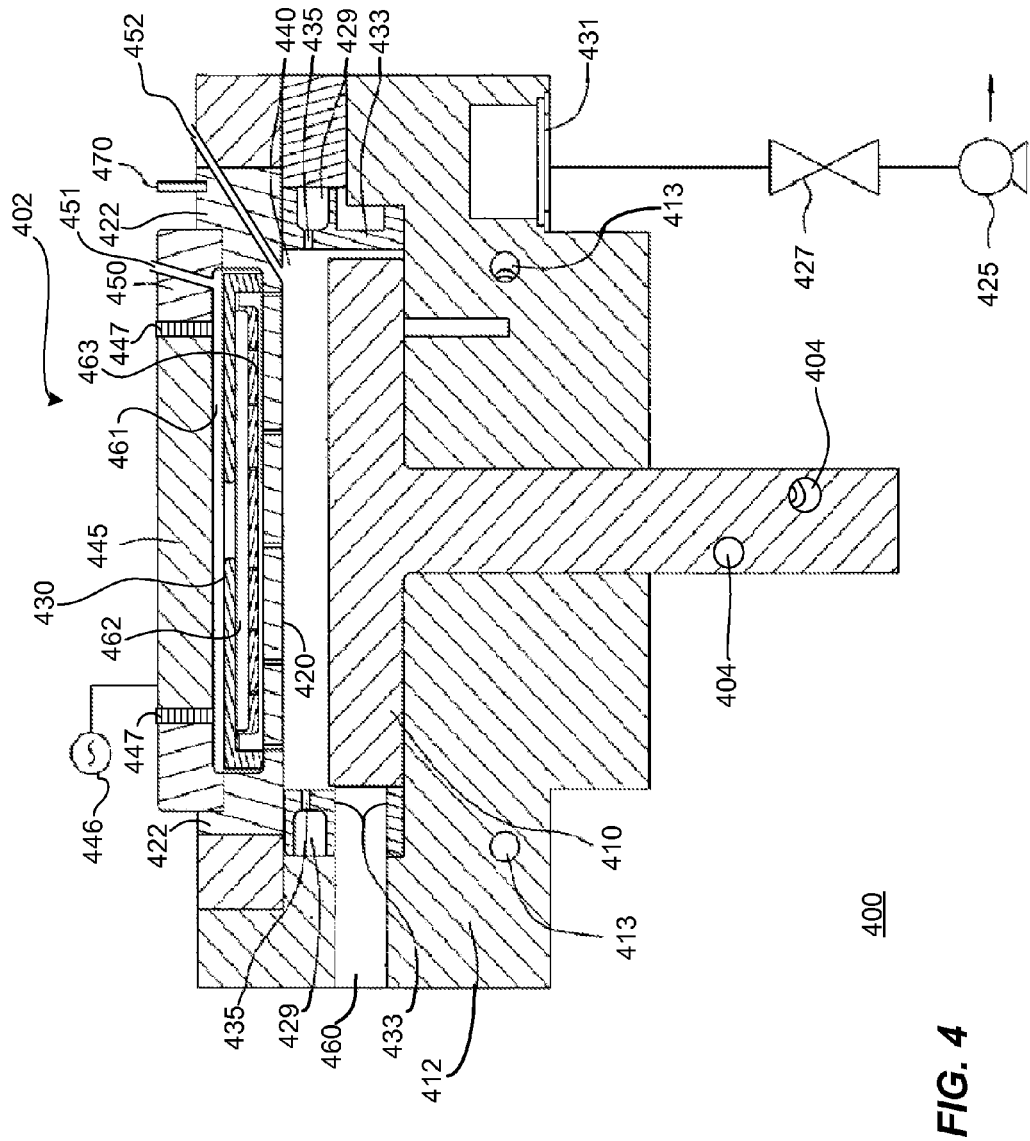
FIG. 4 is a cross-sectional view of a processing chamber for performing etch processes according to disclosed embodiments.

FIG. 4 is a partial cross sectional view showing an illustrative processing chamber 400, in which, embodiments of the invention may be carried out. Generally, a hydrogen-containing precursor and a fluorine-containing precursor may be introduced through one or more apertures 451 into remote plasma region(s) 461-463 and excited by plasma power source 446.

In one embodiment, the processing chamber 400 includes a chamber body 412, a lid assembly 402, and a support assembly 410. The lid assembly 402 is disposed at an upper end of the chamber body 412, and the support assembly 410 is at least partially disposed within the chamber body 412. The processing chamber 400 and the associated hardware are preferably formed from one or more process-compatible materials (e.g. aluminum, stainless steel, etc.).

The chamber body 412 includes a slit valve opening 460 formed in a sidewall thereof to provide access to the interior of the processing chamber 400. The slit valve opening 460 is selectively opened and closed to allow access to the interior of the chamber body 412 by a wafer handling robot (not shown). In one embodiment, a wafer can be transported in and out of the processing chamber 400 through the slit valve opening 460 to an adjacent transfer chamber and/or load-lock chamber, or another chamber within a cluster tool. An exemplary cluster tool which may include processing chamber 400 is shown in FIG. 7.

In one or more embodiments, chamber body 412 includes a chamber body channel 413 for flowing a heat transfer fluid through chamber body 412. The heat transfer fluid can be a heating fluid or a coolant and is used to control the temperature of chamber body 412 during processing and substrate transfer. Heating the chamber body 412 may help to prevent unwanted condensation of the gas or byproducts on the chamber walls. Exemplary heat transfer fluids include water, ethylene glycol, or a mixture thereof. An exemplary heat transfer fluid may also include nitrogen gas. Support assembly 410 may have a support assembly channel 404 for flowing a heat transfer fluid through support assembly 410 thereby affecting the substrate temperature.

The chamber body 412 can further include a liner 433 that surrounds the support assembly 410. The liner 433 is preferably removable for servicing and cleaning. The liner 433 can be made of a metal such as aluminum, or a ceramic material. However, the liner 433 can be any process compatible material. The liner 433 can be bead blasted to increase the adhesion of any material deposited thereon, thereby preventing flaking of material which results in contamination of the processing chamber 400. In one or more embodiments, the liner 433 includes one or more apertures 435 and a pumping channel 429 formed therein that is in fluid communication with a vacuum system. The apertures 435 provide a flow path for gases into the pumping channel 429, which provides an egress for the gases within the processing chamber 400.

The vacuum system can include a vacuum pump 425 and a throttle valve 427 to regulate flow of gases through the processing chamber 400. The vacuum pump 425 is coupled to a vacuum port 431 disposed on the chamber body 412 and therefore, in fluid communication with the pumping channel 429 formed within the liner 433. The terms "gas" and "gases" are used interchangeably, unless otherwise noted, and refer to one or more reactants, catalysts, carrier, purge, cleaning, combinations thereof, as well as any other fluid introduced into the chamber body 412. The term "precursor" is used to refer to any process gas which takes part in a reaction to either remove or deposit material from a surface.

Apertures 435 allow the pumping channel 429 to be in fluid communication with a processing region 440 within the chamber body 412. The processing region 440 is defined by a lower surface of the lid assembly 402 and an upper surface of the support assembly 410, and is surrounded by the liner 433. The apertures 435 may be uniformly sized and evenly spaced about the liner 433. However, any number, position, size or shape of apertures may be used, and each of those design parameters can vary depending on the desired flow pattern of gas across the substrate receiving surface as is discussed in more detail below. In addition, the size, number and position of the apertures 435 are configured to achieve uniform flow of gases exiting the processing chamber 400. Further, the aperture size and location may be configured to provide rapid or high capacity pumping to facilitate a rapid exhaust of gas from the chamber 400. For example, the number and size of apertures 435 in close proximity to the vacuum port 431 may be smaller than the size of apertures 435 positioned farther away from the vacuum port 431.

A gas supply panel (not shown) is typically used to provide process gas(es) to the processing chamber 400 through one or more apertures 451. The particular gas or gases that are used depend upon the process or processes to be performed within the chamber 400. Illustrative gases can include, but are not limited to one or more precursors, reductants, catalysts, carriers, purge, cleaning, or any mixture or combination thereof. Typically, the one or more gases introduced to the processing chamber 400 flow into plasma volume 461 through aperture (s) 451 in top plate 450. Alternatively or in combination, processing gases may be introduced more directly through aperture(s) 452 into processing region 440. Aperture(s) 452 bypass the remote plasma excitation and are useful for processes involving gases that do not require plasma excitation or processes which do not benefit from additional excitation of the gases. Electronically operated valves and/or flow control mechanisms (not shown) may be used to control the flow of gas from the gas supply into the processing chamber 400. Depending on the process, any number of gases can be delivered to the processing chamber 400, and can be mixed either in the processing chamber 400 or before the gases are delivered to the processing chamber 400.

The lid assembly 402 can further include an electrode 445 to generate a plasma of reactive species within the lid assembly 402. In one embodiment, the electrode 445 is supported by top plate 450 and is electrically isolated therefrom by inserting electrically isolating ring(s) 447 made from aluminum oxide or any other insulating and process compatible material. In one or more embodiments, the electrode 445 is coupled to a power source 446 while the rest of lid assembly 402 is connected to ground. Accordingly, a plasma of one or more process gases can be generated in remote plasma region composed of volumes 461, 462 and/or 463 between electrode 445 and annular mounting flange 422. In embodiments, annular mounting flange comprises or supports gas delivery plate 420. For example, the plasma may be initiated and maintained between electrode 445 and one or both blocker plates of blocker assembly 430. Alternatively, the plasma can be struck and contained between the electrode 445 and gas delivery plate 420, in the absence of blocker assembly 430. In either embodiment, the plasma is well confined or contained within the lid assembly 402. Accordingly, the plasma is a "remote plasma" since no active plasma is in direct contact with the substrate disposed within the chamber body 412. As a result, plasma damage to the substrate may be avoided since the plasma is separated from the substrate surface.

A wide variety of power sources 446 are capable of activating the hydrogen-containing precursor (e.g. ammonia) and the nitrogen-containing precursor (nitrogen trifluoride). For example, radio frequency (RF), direct current (DC), or microwave (MW) based power discharge techniques may be used. The activation may also be generated by a thermally based technique, a gas breakdown technique, a high intensity light source (e.g., UV energy), or exposure to an x-ray source. Alternatively, a remote activation source may be used, such as a remote plasma generator, to generate a plasma of reactive species which are then delivered into the chamber 400. Exemplary remote plasma generators are available from vendors such as MKS Instruments, Inc. and Advanced Energy Industries, Inc. In the exemplary processing system an RF power supply is coupled to electrode 445. A higher-power microwave power source 446 is beneficial in the event that reactive oxygen will also be produced using power source 446.

The temperatures of the process chamber body 412 and the substrate may each be controlled by flowing a heat transfer medium through chamber body channel 413 and support assembly channel 404, respectively. Support assembly channel 404 may be formed within support assembly 410 to facilitate the transfer of thermal energy. Chamber body 412 and support assembly 410 may be cooled or heated independently. For example, a heating fluid may be flown through one while a cooling fluid is flown through the other.

Other methods may be used to control the substrate temperature. The substrate may be heated by heating the support assembly 410 (or a portion thereof, such as a pedestal) with a resistive heater or by some other means. In another configuration, gas delivery plate 420 may be maintained at a temperature higher than the substrate and the substrate can be elevated in order to raise the substrate temperature. In this case the substrate is heated radiatively or by using a gas to conduct heat from gas delivery plate 420 to the substrate. The substrate may be elevated by raising support assembly 410 or by employing lift pins.

During the etch processes described herein, chamber body 412 may be maintained within an approximate temperature range of between 50° C. and 80° C., between 55° C. and 75° C. or between 60° C. and 70° C. in different embodiments. During exposure to plasma effluents and/or oxidizing agents, the substrate may be maintained below the temperatures given previously, between about 15° C. and about 50° C., between about 22° C. and about 40° C., or near 30° C. in different embodiments.

Plasma effluents include a variety of molecules, molecular fragments and ionized species. Currently entertained theoretical mechanisms of Siconi™ etching may or may not be entirely correct but plasma effluents are thought to include $NH_4F$ and $NH_4F.HF$ which react readily with low temperature substrates described herein. Plasma effluents may react with a silicon oxide surface to form $(NH_4)_2SiF_6$, $NH_3$ and $H_2O$ products. The $NH_3$ and $H_2O$ are vapors under the processing conditions described herein and may be removed from processing region 440 by vacuum pump 425. A thin continuous or discontinuous layer of $(NH_4)_2SiF_6$ solid by-products is left behind on the substrate surface.

Following exposure to plasma effluents and the associated accumulation of solid by-products, the substrate may be heated to remove the by-products. In embodiments, the gas delivery plate 420 is heatable by incorporating heating element 470 within or near gas delivery plate 420. The substrate may be heated by reducing the distance between the substrate and the heated gas delivery plate. The gas delivery plate 420 may be heated to between about 100° C. and 150° C., between about 110° C. and 140° C. or between about 120° C. and 130° C. in different embodiments. By reducing the separation between the substrate and the heated gas delivery plate, the substrate may be heated to above about 75° C., above about 90° C., above about 100° C. or between about 115° C. and about 150° C. in different embodiments. The heat radiated from gas delivery plate 420 to the substrate should be made sufficient to dissociate or sublimate solid $(NH_4)_2SiF_6$ on the substrate into volatile $SiF_4$, $NH_3$ and HF products which may be pumped away from processing region 440. Other methods of imparting heat to the substrate may also be used.

Nitrogen trifluoride (or another fluorine-containing precursor) may be flowed into remote plasma volume 461 at rates between about 25 sccm and about 200 sccm, between about 50 sccm and about 150 sccm or between about 75 sccm and about 125 sccm in different embodiments. Ammonia (or hydrogen-containing precursors in general) may be flowed into remote plasma volume 461 at rates between about 50 sccm and about 300 sccm, between about 75 sccm and about 250 sccm, between about 100 sccm and about 200 sccm or between about 120 sccm and about 170 sccm in different embodiments. One of the methods used to achieve slow dry etching involves reducing the nitrogen trifluoride flow rate below or about one quarter, one eighth or one tenth of the flow rate of the ammonia.

Combined flow rates of hydrogen-containing and fluorine-containing precursors into the remote plasma region may account for 0.05% to about 20% by volume of the overall gas mixture; the remainder being a carrier gas. In one embodiment, a purge or carrier gas is first initiated into the remote plasma region before those of the reactive gases to stabilize the pressure within the remote plasma region.

Production of the plasma effluents occurs within volumes 461, 462 and/or 463 by applying plasma power to electrode 445 relative to the rest of lid assembly 402. Plasma power can be a variety of frequencies or a combination of multiple frequencies. In the exemplary processing system the plasma is provided by RF power delivered to electrode 445. The RF power may be between about 1 W and about 1000 W, between about 5 W and about 600 W, between about 10 W and about 300 W or between about 20 W and about 100 W in different embodiments. The RF frequency applied in the exemplary processing system may be less than about 200 kHz, less than about 150 kHz, less than about 120 kHz or between about 50 kHz and about 90 kHz in different embodiments.

Processing region 440 can be maintained at a variety of pressures during the flow of ozone, oxygen, carrier gases and/or plasma effluents into processing region 440. The pressure may be maintained between about 500 mTorr and about 30 Torr, between about 1 Torr and about 10 Torr or between about 3 Torr and about 6 Torr in different embodiments. Lower pressures may also be used within processing region 440. The pressure may be maintained below or about 500 mTorr, below or about 250 mTorr, below or about 100 mTorr, below or about 50 mTorr or below or about 20 mTorr in different embodiments.

In one or more embodiments, the processing chamber 400 can be integrated into a variety of multi-processing platforms, including the Producer™ GT, Centura™ AP and Endura™ platforms available from Applied Materials, Inc. located in Santa Clara, Calif. Such a processing platform is capable of performing several processing operations without breaking vacuum.

Deposition chambers that may implement embodiments of the present invention may include dielectric etch chambers, high-density plasma chemical vapor deposition (HDP-CVD) chambers, plasma enhanced chemical vapor deposition (PECVD) chambers, sub-atmospheric chemical vapor deposition (SACVD) chambers, and thermal chemical vapor deposition chambers, among other types of chambers.

Figure 5:
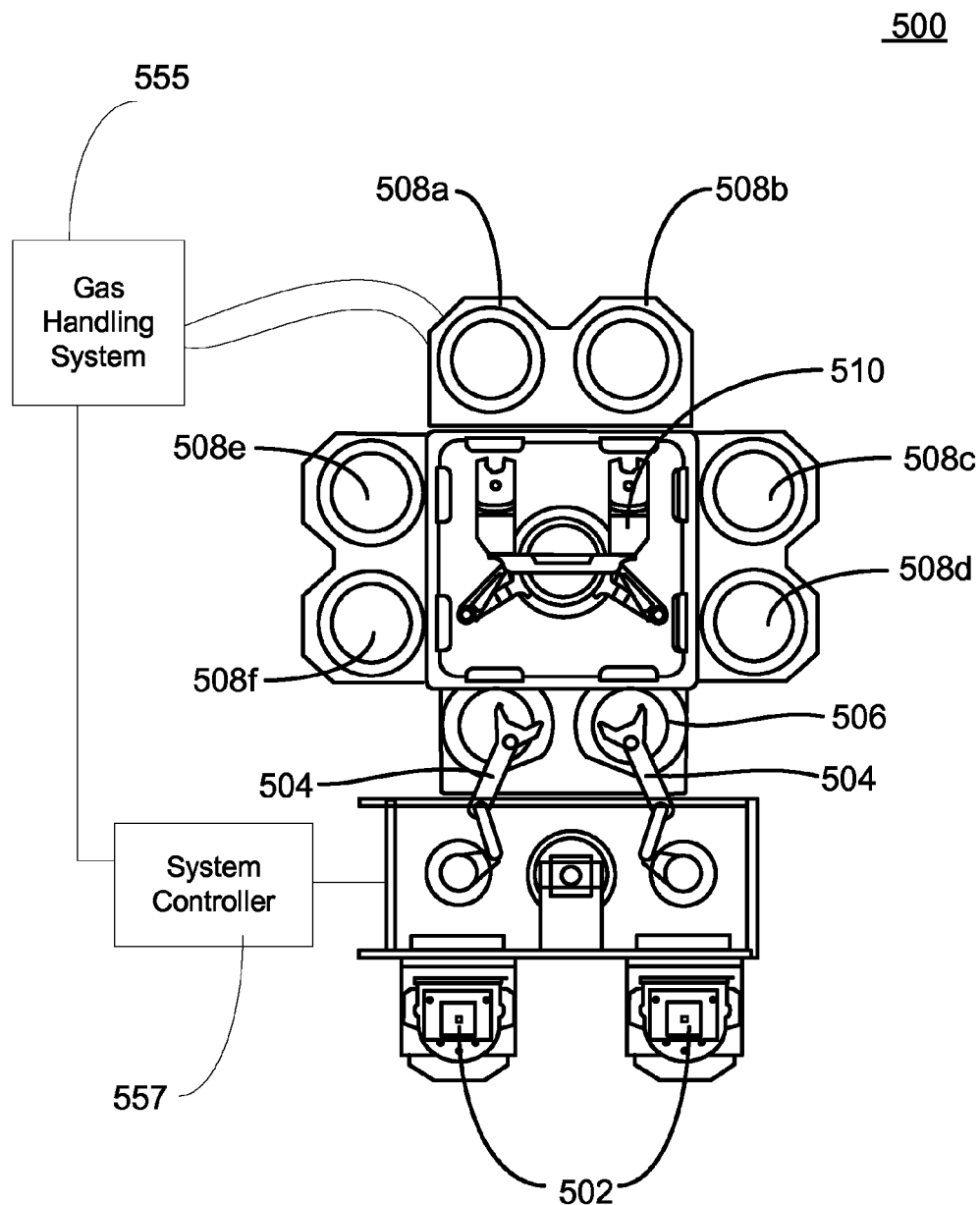
FIG. 5 is a processing system for performing etch processes according to disclosed embodiments.

Embodiments of the deposition systems may be incorporated into larger fabrication systems for producing integrated circuit chips. FIG. 5 shows one such system 500 of deposition, baking and curing chambers according to disclosed embodiments. In the figure, a pair of FOUPs (front opening unified pods) 502 supply substrate substrates (e.g., 300 mm diameter wafers) that are received by robotic arms 504 and placed into a low pressure holding area 506 before being placed into one of the wafer processing chambers 508*a-f*. A second robotic arm 510 may be used to transport the substrate wafers from the holding area 506 to the processing chambers 508*a-f* and back. Each processing chamber 508*a-f*, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation and other substrate processes.

The processing chambers 508*a-f* may include one or more system components for depositing, annealing, curing and/or etching a flowable dielectric film on the substrate wafer. In one configuration, two pairs of the processing chamber (e.g., 508*c-d* and 508*e-f*) may be used to deposit dielectric material on the substrate, and the third pair of processing chambers (e.g., 508*a-b*) may be used to etch the deposited dielectric. In another configuration, all three pairs of chambers (e.g., 508*a-f*) may be configured to etch a dielectric film on the substrate. Any one or more of the processes described may be carried out on chamber(s) separated from the fabrication system shown in different embodiments.

System controller 557 is used to control motors, valves, flow controllers, power supplies and other functions required to carry out process recipes described herein. A gas handling system 555 may also be controlled by system controller 557 to introduce gases to one or all of the processing chambers 508*a-f*. System controller 557 may rely on feedback from optical sensors to determine and adjust the position of movable mechanical assemblies in gas handling system 555 and/or in processing chambers 508*a-f*. Mechanical assemblies may include the robot, throttle valves and susceptors which are moved by motors under the control of system controller 557.

In an exemplary embodiment, system controller 557 includes a hard disk drive (memory), USB ports, a floppy disk drive and a processor. System controller 557 includes analog and digital input/output boards, interface boards and stepper motor controller boards. Various parts of multi-chamber processing system 500 which contains processing chamber 400 are controlled by system controller 557. The system controller executes system control software in the form of a computer program stored on computer-readable medium such as a hard disk, a floppy disk or a flash memory thumb drive. Other types of memory can also be used. The computer program includes sets of instructions that dictate the timing, mixture of gases, chamber pressure, chamber temperature, RF power levels, susceptor position, and other parameters of a particular process.

A process for etching, depositing or otherwise processing a film on a substrate or a process for cleaning chamber can be implemented using a computer program product that is executed by the controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller may be via a touch-sensitive monitor and may also include a mouse and keyboard. In one embodiment two monitors are used, one mounted in the clean room wall for the operators and the other behind the wall for the service technicians. The two monitors may simultaneously display the same information, in which case only one is configured to accept input at a time. To select a particular screen or function, the operator touches a designated area on the display screen with a finger or the mouse. The touched area changes its highlighted color, or a new menu or screen is displayed, confirming the operator's selection.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. "Silicon oxide" may include minority concentrations of other elemental constituents such as nitrogen, hydrogen, carbon and the like. A gas may be a combination of two or more gases. The term "trench" is used throughout with no implication that the etched geometry has a large horizontal aspect ratio. Viewed from above the surface, trenches may appear circular, oval, polygonal, rectangular, or a variety of other shapes.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of etching silicon oxide from multiple trenches on a surface of a patterned substrate in a substrate processing region of a substrate process chamber, the method comprising the sequential steps of:
   dry etching the silicon oxide in each of the multiple trenches in a first dry-etch stage using plasma effluents generated from a fluorine-containing precursor and a hydrogen-containing precursor to form first solid by-products on the surface of a remaining silicon oxide in the multiple trenches, wherein the silicon oxide is removed at a first etch rate during the first dry-etch stage;
   increasing a flow ratio of the hydrogen-containing precursor to the fluorine-containing precursor and/or decreasing plasma power used to form the plasma effluents to reduce an etch rate of the dry etching the silicon oxide in each of the multiple trenches in a second dry-etch stage to form second solid-by-products on the surface of remaining silicon oxide in the multiple trenches, wherein a second etch rate of the silicon oxide during the second dry-etch stage is less than the first etch rate; and
   sublimating the first and second solid by-products from the multiple trenches.

2. The method of claim 1 wherein the first solid by-products are not sublimated between the first dry-etch stage and the second dry-etch stage.

3. The method of claim 1 wherein essentially no delay between the first dry-etch stage and the second dry-etch stage.

4. The method of claim 1 wherein a width of each of the multiple trenches is less than 35 nm.

5. The method of claim 1 wherein a duration of the first dry-etch stage exceeds a duration of the second dry-etch stage.

6. The method of claim 1 wherein a duration of the first dry-etch stage is between about 15 seconds and about 1 minute.

7. The method of claim 1 wherein a duration of the second dry-etch stage is between about 5 seconds and about 30 seconds.

8. The method of claim 1 wherein the silicon oxide is maintained below 60° C. during the first and second dry-etch stages.

9. The method of claim 1 wherein the silicon oxide is raised above 90° C. during the operations of sublimating the first and second solid by products from the multiple trenches.

10. The method of claim 1 wherein the first etch rate is more than about twice the second etch rate.

11. The method of claim 1 wherein the first etch rate is more than about three times the second etch rate.

12. The method of claim 1 wherein the first etch rate is more than about five times the second etch rate.

13. The method of claim 1 wherein the first etch rate is between one and about five times the second etch rate.

14. The method of claim 1 wherein the dry etching of the first dry-etch stage becomes self-limiting in about one minute or less and the dry etching of the second dry-etch stage becomes self-limiting in about two minutes or more.

15. The method of claim 1 wherein each of the dry etching operations comprise:
   flowing a fluorine-containing precursor and a hydrogen-containing precursor into a remote plasma region fluidly coupled to the substrate processing region while forming a plasma in the remote plasma region to produce plasma effluents.

16. The method of claim 15 wherein the hydrogen-containing precursor comprises at least one precursor selected from the group consisting of atomic hydrogen, molecular hydrogen, ammonia, a hydrocarbon and an incompletely halogen-substituted hydrocarbon.

17. The method of claim 15 wherein the fluorine-containing precursor comprises at least one precursor selected from the group consisting of nitrogen trifluoride, hydrogen fluoride, diatomic fluorine, monatomic fluorine and fluorine-substituted hydrocarbons.

18. A multistep method of etching silicon oxide from multiple trenches on a surface of a patterned substrate positioned in a substrate processing chamber, the method comprising:
   etching the silicon oxide layer in a first dry etch step using plasma effluents generated from a fluorine-containing precursor and a hydrogen-containing precursor, wherein the first dry etch step removes a first portion of the silicon oxide from the multiple trenches at a first etch rate and form first solid by-products;

increasing a flow ratio of the hydrogen-containing precursor to the fluorine-containing precursor and/or decreasing plasma power used to form the plasma effluents to remove a second portion of the silicon oxide layer from the multiple trenches at a second etch rate that is less than the first etch rate;

etching the silicon oxide layer in a second dry etch step using the second set of process parameters, wherein the second dry etch step removes a second portion of the silicon oxide from the multiple trenches at the second etch rate and forms second by-products; and thereafter, sublimate the first and second solid by-products.

19. The method of claim 1 wherein the hydrogen-containing source comprises ammonia, the fluorine-containing source comprises nitrogen trifluoride and reducing the etch rate comprises increasing a flow ratio of the hydrogen-containing source to the fluorine-containing source.

20. The method of claim 1 wherein reducing the etch rate comprises reducing the plasma power by between 30-50 from the first dry etch stage to the second dry etch stage.

* * * * *